US012740010B2

(12) United States Patent
Lee et al.

(10) Patent No.: US 12,740,010 B2
(45) Date of Patent: Sep. 15, 2026

(54) POWER MODULE COOLING DEVICE

(71) Applicants: Hyundai Motor Company, Seoul (KR); Kia Corporation, Seoul (KR)

(72) Inventors: Sang Hun Lee, Whasung-Si (KR); Hyong Joon Park, Whasung-Si (KR); Se Heun Kwon, Whasung-Si (KR)

(73) Assignees: Hyundai Motor Company, Seoul (KR); Kia Corporation; Seoul, Seoul (KR)

( * ) Notice: Subject to any disclaimer, the term of this patent is extended or adjusted under 35 U.S.C. 154(b) by 212 days.

(21) Appl. No.: 18/389,116

(22) Filed: Nov. 13, 2023

(65) Prior Publication Data

US 2024/0431071 A1 Dec. 26, 2024

(30) Foreign Application Priority Data

Jun. 22, 2023 (KR) ........................ 10-2023-0080601

(51) Int. Cl.
*H05K 7/20* (2006.01)

(52) U.S. Cl.
CPC ..... *H05K 7/20272* (2013.01); *H05K 7/20927* (2013.01)

(58) Field of Classification Search
CPC ............. H05K 7/20927; H05K 7/2089; H05K 7/20254; H05K 7/20272; H05K 7/14329; H05K 7/20145; H05K 7/20218; H05K 1/0209; H01L 23/473; H01L 23/46; H01L 2924/13055; H01L 2924/13091; F28F 3/12; F28F 2215/04; H02K 11/33
See application file for complete search history.

(56) References Cited

U.S. PATENT DOCUMENTS

| | | | | |
|---|---|---|---|---|
| 9,445,526 | B2 | 9/2016 | Zhou et al. | |
| 10,798,855 | B2 * | 10/2020 | Uneme | H01L 23/473 |
| 11,602,087 | B2 * | 3/2023 | Zhou | H05K 7/20336 |
| 11,849,569 | B2 * | 12/2023 | Zhou | H05K 7/20254 |
| 2006/0096738 | A1 * | 5/2006 | Kang | F28F 3/022 257/E23.098 |
| 2014/0327128 | A1 * | 11/2014 | Yoo | H01L 23/29 257/713 |

(Continued)

FOREIGN PATENT DOCUMENTS

| | | |
|---|---|---|
| KR | 10-2014-0084590 | 7/2014 |

*Primary Examiner* — Jayprakash N Gandhi
*Assistant Examiner* — Matthew Sinclair Muir
(74) *Attorney, Agent, or Firm* — MORGAN, LEWIS & BOCKIUS LLP

(57) ABSTRACT

A power module cooling device includes a manifold cover and a fin plate contained in the manifold cover, wherein a cooling fluid is ejected perpendicularly to heating surfaces through cooling fins of the fin plate configured perpendicularly to the longitudinal direction of the manifold cover so that a vertical turbulent flow of the cooling fluid is generated, thereby securing cooling efficiency, and flow characteristics of the cooling fluid are improved, minimizing flow rate loss due to the vertical turbulent flow. respective cooling channel portions of the manifold cover corresponding to respective power modules have different cooling performances so that respective power modules are cooled in a balanced manner. Accordingly, cooling imbalance is removed, and the power modules are thus stabilized and maintain performance.

12 Claims, 6 Drawing Sheets

(56) References Cited

U.S. PATENT DOCUMENTS

| | | | | |
|---|---|---|---|---|
| 2017/0055378 | A1* | 2/2017 | Zhou | H05K 7/20927 |
| 2019/0341327 | A1* | 11/2019 | Teysseyre | H10W 40/22 |
| 2021/0337703 | A1* | 10/2021 | Lee | H01L 23/473 |
| 2022/0248560 | A1* | 8/2022 | Zhou | H05K 7/2039 |

* cited by examiner

POWER MODULE COOLING DEVICE

CROSS-REFERENCE TO RELATED APPLICATION(S)

The present application claims priority to Korean Patent Application No. 10-2023-0080601, filed on Jun. 22, 2023, the entire contents of which is incorporated herein for all purposes by this reference.

BACKGROUND OF THE PRESENT DISCLOSURE

Field of the Present Disclosure

The present disclosure relates to a power module cooling device configured to cool a power module by use of a cooling fluid.

Description of Related Art

Power modules are applied to electric cars and the like to control high voltages and large currents. As a result, a substantially large amount of heat is generated, and appropriate cooling is thus necessary to main performance and durability. To the present end, a cooling fluid is used to cool power modules, or waste heat from power modules is used to heat mobility vehicles, for example.

Conventionally, a cooling device is commonly connected to a side surface of a power module, and a cooling fluid is circulated through the power module to cool the power module. However, conventional cooling devices include a problem in that the cooling efficiency is not high because commonly available simple tube structures or fin structures are applied thereto.

If multiple power modules are used, the cooling efficiency of power modules which are cooled later is degraded compared with that of power modules which are cooled first. Such an imbalance in cooling of power modules degrades the performance thereof.

Accordingly, the cooling efficiency of an electric vehicle or the like is closely related to the overall energy efficiency of the mobility vehicle, and includes a large influence of durability, performance maintenance, and the like of the power module. It is therefore necessary to improve the efficiency of power module cooling through a new cooling structure.

The information included in this Background of the present disclosure is only for enhancement of understanding of the general background of the present disclosure and may not be taken as an acknowledgement or any form of suggestion that this information forms the prior art already known to a person skilled in the art.

BRIEF SUMMARY

Various aspects of the present disclosure are directed to providing a power module cooling device, wherein a cooling fluid is ejected perpendicularly to heating surfaces through cooling fins of a fin plate configured perpendicularly to the longitudinal direction of a manifold cover so that a vertical turbulent flow of the cooling fluid is generated, securing cooling efficiency, and flow characteristics of the cooling fluid are improved, minimizing flow rate loss due to the vertical turbulent flow.

In accordance with an aspect of the present disclosure, a power module cooling device may include: a manifold cover including an internal space in which a cooling fluid is circulated, a plurality of power modules being disposed in the internal space, a plurality of cooling channel portions being formed to match with respective power modules, and each cooling channel portion including a first channel open in a direction in which the cooling fluid flows in and a second channel open in a direction in which the cooling fluid flows out; and a fin plate disposed in the manifold cover to abut the plurality of power modules, and including cooling fins facing the plurality of cooling channel portions so that the cooling fluid which has flowed into the first channels flows between the cooling fins and then flows out through the second channels, wherein respective cooling channel portions of the manifold cover include a reduced number of the first channels or the second channels along a direction of circulation of the cooling fluid.

The a plurality of power modules may be disposed in series in the internal space of the manifold cover so that the plurality of cooling channel portions are disposed in series in a direction in which respective power modules are aligned.

Respective cooling channel portions may include a smaller number of first channels formed therein than second channels therein.

The power modules may include a first power module, a second power module, and a third power module, the plurality of cooling channel portions may include a first cooling channel portion, a second cooling channel portion, and a third cooling channel portion, and the third cooling channel portion may include a smaller number of first channels or second channels formed therein than first channels or second channels of the first cooling channel portion and the second cooling channel portion.

The plurality of cooling channel portions may include a plurality of first barrier portions extending to delimit the first channels and the second channels, second barrier portions connected to the first barrier portions on both sides at end portions of first channels in a direction in which the cooling fluid flows out, and third barrier portions connected to the first barrier portions on both sides at end portions of second channels in a direction in which the cooling fluid flows in.

The plurality of cooling channel portions may have second barrier portions and third barrier portions disposed alternately to connect a plurality of first barrier portions so that first channels and second channels are provided alternately.

The direction of extension of the first barrier portions and the direction of extension of the cooling fins may intersect perpendicularly.

The manifold cover may include a first manifold cover and a second manifold cover including one of an inlet and an outlet formed therein, and the fin plate may include a first fin plate and a second fin plate disposed to abut first and second side surfaces of the power modules, respectively, the first fin plate including a first circulation hole formed therein and the second fin plate including a second circulation hole formed therein so that a cooling fluid is circulated between respective manifold covers, cooling the first and second surfaces of the power modules.

Each of the first manifold cover and the second manifold cover may include an inlet or an outlet formed on one side thereof, and the first circulation hole of the first fin plate and the second circulation hole of the second fin plate may be formed on the other side thereof.

A power module cooling device including the above-described structure is advantageous in that a cooling fluid is ejected perpendicularly to heating surfaces through cooling fins of a fin plate configured perpendicularly to the longitudinal direction of a manifold cover so that a vertical turbulent flow of the cooling fluid is generated, securing cooling efficiency, and flow characteristics of the cooling fluid are improved, minimizing flow rate loss due to the vertical turbulent flow.

Respective cooling channel portions of the manifold cover corresponding to respective power modules have different cooling performances so that respective power modules are cooled in a balanced manner. Accordingly, cooling imbalance is removed, and the power modules are thus stabilized and maintain performance.

The methods and apparatuses of the present disclosure have other features and advantages which will be apparent from or are set forth in more detail in the accompanying drawings, which are incorporated herein, and the following Detailed Description, which together serve to explain certain principles of the present disclosure.

BRIEF DESCRIPTION OF THE DRAWINGS

Figure 1:
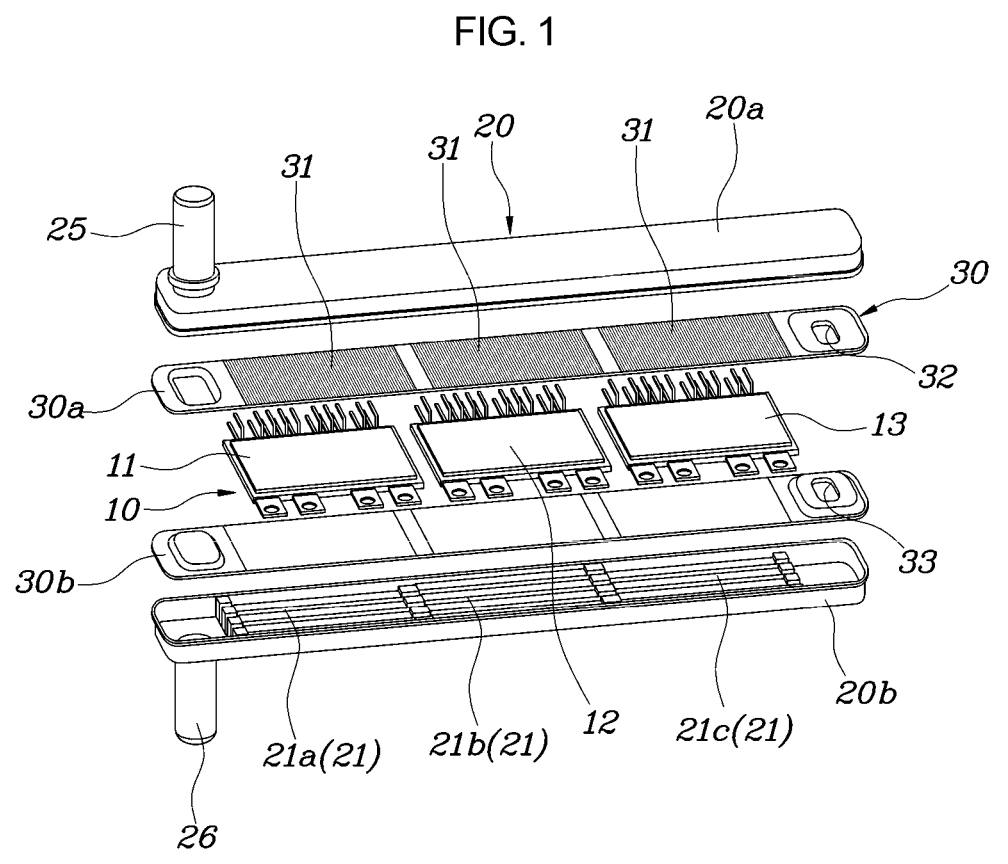

FIG. 1 is an assembled view of a power module cooling device according to an exemplary embodiment of the present disclosure;

FIG. 6 illustrates another exemplary embodiment of a cooling channel portion of a manifold cover according to an exemplary embodiment of the present disclosure.

Figure 2:
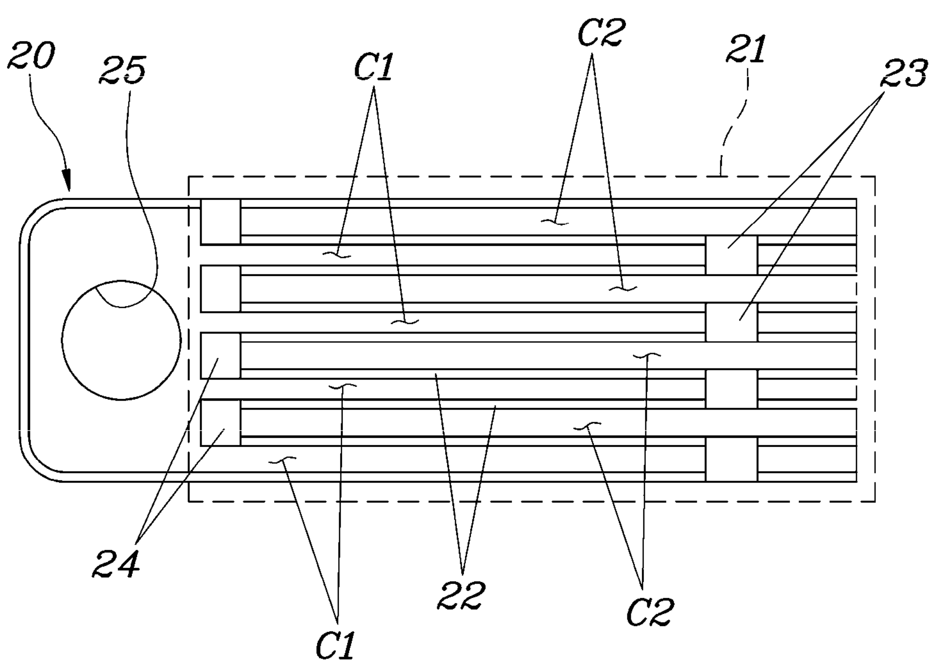
FIG. 2 illustrates a cooling channel portion of a manifold cover of the power module cooling device illustrated in FIG. 1.

It may be understood that the appended drawings are not necessarily to scale, presenting a somewhat simplified representation of various features illustrative of the basic principles of the present disclosure. The predetermined design features of the present disclosure as included herein, including, for example, specific dimensions, orientations, locations, and shapes will be determined in part by the particularly intended application and use environment.

In the figures, reference numbers refer to the same or equivalent portions of the present disclosure throughout the several figures of the drawing.

DETAILED DESCRIPTION

Reference will now be made in detail to various embodiments of the present disclosure(s), examples of which are illustrated in the accompanying drawings and described below. While the present disclosure(s) will be described in conjunction with exemplary embodiments of the present disclosure, it will be understood that the present description is not intended to limit the present disclosure(s) to those exemplary embodiments of the present disclosure. On the other hand, the present disclosure(s) is/are intended to cover not only the exemplary embodiments of the present disclosure, but also various alternatives, modifications, equivalents and other embodiments, which may be included within the spirit and scope of the present disclosure as defined by the appended claims.

Hereinafter, various exemplary embodiments included in the present specification will be described in detail with reference to the accompanying drawings, and the same or similar elements are provided the same and similar reference numerals, so duplicate descriptions thereof will be omitted.

The terms "module" and "unit" used for the elements in the following description are provided or interchangeably used in consideration of only the ease of writing the specification, and do not have distinct meanings or roles by themselves.

In describing the exemplary embodiments included in the present specification, when the detailed description of the relevant known technology is determined to unnecessarily obscure the gist of the present disclosure, the detailed description may be omitted. Furthermore, the accompanying drawings are provided only for easy understanding of the exemplary embodiments included in the present specification, and the technical spirit included herein is not limited to the accompanying drawings, and it should be understood that all changes, equivalents, or substitutes thereof are included in the spirit and scope of the present disclosure.

Terms including an ordinal number such as "first", "second", or the like may be used to describe various elements, but the elements are not limited to the terms. The above terms are used only for distinguishing one element from another element.

In the case where an element is referred to as being "connected" or "coupled" to any other element, it should be understood that another element may be provided therebetween, as well as that the element may be directly connected or coupled to the other element. In contrast, in the case where an element is "directly connected" or "directly coupled" to any other element, it should be understood that no other element is present therebetween.

A singular expression may include a plural expression unless they are definitely different in a context.

As used herein, the expression "comprise", "include" or "have" are intended to specify the existence of mentioned features, numbers, steps, operations, elements, components, or combinations thereof, and should be construed as not precluding the possible existence or addition of one or more other features, numbers, steps, operations, elements, components, or combinations thereof.

Hereinafter, a power module cooling device according to an exemplary embodiment of the present disclosure will be described with reference to the accompanying drawings.

A power module cooling device according to an exemplary embodiment of the present disclosure includes, as illustrated in FIG. 1, FIG. 2, FIG. 3 and FIG. 4, a manifold cover 20 and a fin plate 30. The manifold cover 20 includes an internal space in which a cooling fluid is circulated, and a plurality of power modules 10 are disposed in the internal space. The manifold cover 20 includes a plurality of cooling channel portions 21 matching with respective power modules 10. Each cooling channel portion 21 includes a first channel C1 open in a direction in which a cooling fluid flows in, and a second channel C2 open in a direction in which the cooling fluid flows out. The fin plate 30 is contained in the manifold cover 20 to abut the plurality of power modules 10. The fin plate 30 has cooling fins 31 formed to face the cooling channel portions 21 so that a cooling fluid which has flowed into the first channels C1 flows between the cooling fins 31 and then flows out through the second channels C2.

The manifold cover 20 is formed so that a cooling fluid is circulated therein, and may include an inlet 25 through which a cooling fluid flows in and an outlet 26 through which the cooling fluid flows out after passing through power modules 10.

A plurality of cooling channel portions 21 are formed inside the manifold cover 20 to match with the power modules 10 so that as a cooling fluid is circulated through the cooling channel portions 21, the cooling channel portions 21 mediate heat exchange between the cooling fluid and the power modules 10, thereby cooling the power modules 10. Each cooling portion 21 includes a first channel C1 and a second channel C2 formed to switch the direction in which the cooling fluid is circulated.

The fin plate 30 is contained in the manifold cover 20 and has cooling fins 31 formed to face the cooling channel portions 21.

The cooling channel portions 21 may include a plurality of first barrier portions 22 extending so that first channels C1 and second channels C2 are delimited, second barrier portions 23 connected to first barrier portions 22 on both sides at end portions of first channels C1 in directions in which a cooling fluid flows out, and third barrier portions 24 connected to first barrier portions 22 on both sides at end portions of second channels C2 in directions in which a cooling fluid flows in.

The cooling channel portions 21 include a plurality of first barrier portions 22, second barrier portions 23, and third barrier portions so that a cooling fluid is discharged from first channels C1 to second channels C2 after passing through cooling fins 31. According to an exemplary embodiment of the present disclosure, the cooling channel portions 21 are configured so that the second barrier portions 23 are connected in perpendicular directions in the first barrier portions 22, but is not limited thereto.

The cooling channel portions 21 have second barrier portions 23 and third barrier portions 24 disposed alternately to connect a plurality of first barrier portions 22 so that first channels C1 and second channels C2 are arranged alternately. Accordingly, a cooling fluid is distributed to the first channels C1 and the second channels C2, facilitating the formation of a jet impingement cooling structure.

The first barrier portions 22 are configured to extend in the direction in which a cooling fluid is circulated, and are spaced by a predetermined interval, forming a plurality of channels. If a second barrier portion 23 is connected to a first barrier portion 22 at an end portion adjacent to an exit in the direction in which the cooling fluid is circulated, the corresponding channel forms a first channel C1. If a third barrier portion 24 is connected to a first barrier portion 22 at an end portion adjacent to an entrance in the direction in which the cooling fluid is circulated, the corresponding channel forms a second channel C2. Furthermore, second barrier portions 23 and third barrier portions 24 may be disposed alternately so that first channels C1 and second channels C2 are disposed alternately.

Accordingly, the cooling channel portions 21 have first channels C1 and second channels C2 formed by a plurality of first barrier portions 22, second barrier portions 23, and third barrier portions, and cooling fins 31 of the fin plate 30 make contact with therewith, forming first channels C1 and second channels C2 together so that a cooling fluid may be circulated through the first channels C1 and the second channels C2 through the cooling fins 31.

Figure 3:
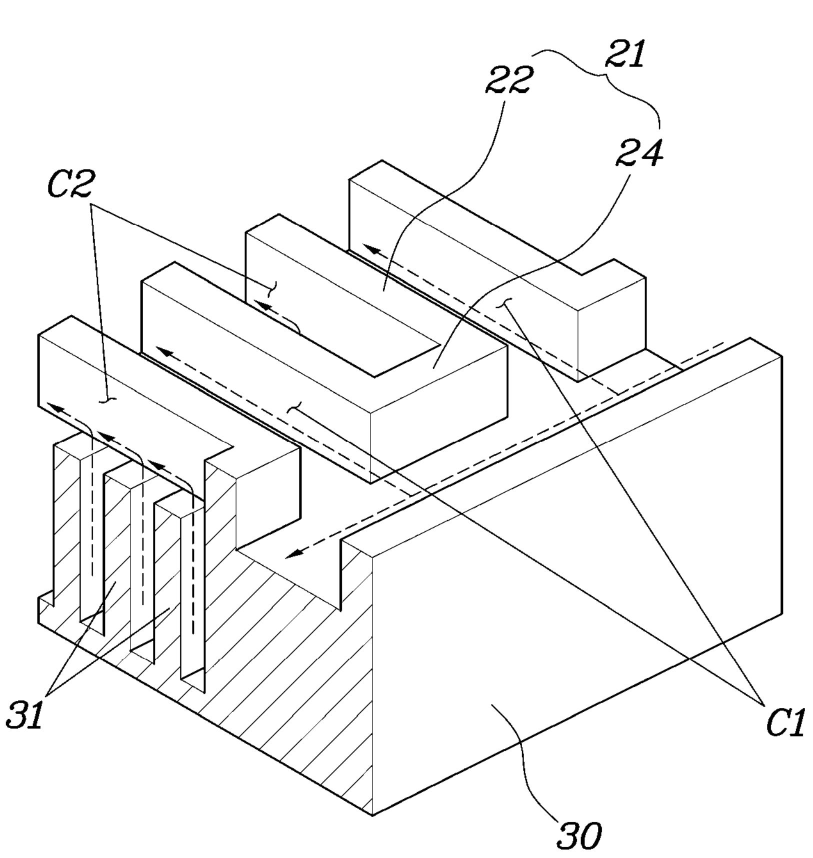
FIG. 3 illustrates a jet impingement effect of a power module cooling device according to an exemplary embodiment of the present disclosure.

Furthermore, the direction in which the first barrier portions 22 extend and the direction in which the cooling fins 31 extend may intersect perpendicularly as illustrated in FIG. 3.

The first barrier portions 22 extend in the longitudinal direction of the manifold cover 20 so that the first channels C1 and the second channels C2 extend in the longitudinal direction of the manifold cover 20. The cooling fins 31 of the fin plate 30 extend perpendicularly to the direction in which the first barrier portions 22 extend so that a cooling fluid is circulated from the first channels C1 to the second channels C2 through the cooling fins 31. This induces the occurrence of a turbulence (a velocity component in the perpendicular direction) while the cooling fluid is circulated from the first channels C1 to the second channels C2, forming a jet impingement cooling structure.

Accordingly, the cooling fluid circulated in the internal space of the manifold cover 20 is distributed to a plurality of first channels C1, respectively. The first channels C1 are open only in the direction in which the cooling fluid flows in, exits thereof being blocked so that the cooling fluids flow between the cooling fins 31 of the fin plate 30 and is then circulated to the second channels C2. The second channels C2 are open only in the direction in which the cooling fluid flows out, entrances thereof being blocked so that the cooling fluid circulated to the second channels C2 may be discharged out of the manifold cover 20.

Accordingly, according to an exemplary embodiment of the present disclosure, a jet impingement cooling structure is formed by a fluid flow, improving the cooling performance regarding power modules 10. Jet impingement cooling refers to a cooling scheme in which cooling air is directly ejected to a high-temperature wall surface so that heat is removed, obtaining a locally high degree of heat transfer. To actively implement an effect of such a jet impingement cooling scheme, it is necessary to utilize a turbulent flow instead of a laminar flow. The laminar flow refers to a flow including a velocity component perpendicular to the direction of flow, that is, a flow having a 3D vorticity in upward/downward/leftward/rightward direction (not flow direction) so that the flow is irregular and dispersive. A turbulent flow, if generated around an object, further increases the cooling area and cooling fluid mixing, improving the cooling effect.

The jet impingement cooling will now be described in detail. FIG. 3 illustrates a microchannel of a power module cooling device according to an exemplary embodiment of the present disclosure. As illustrated in FIG. 3, a cooling fluid flows in from the entrance and forms an inlet plenum (gathering of narrow streams). The manifold cover 20 is guided based on the cooling channel portion 21 so that the cooling fluid flowing into first channels C1 or second channels C2 flows to the plurality of cooling fins 31. That is, the cooling fluid flowing into the first channels C1 is blocked at the exits, flows to the cooling fins 31, and then flows into the second channels C2, forming a turbulent flow. Furthermore, entrances of the second channels C2 are closed so that the cooling fluid flows toward the exits, passes through the cooling fins 31, and is then discharged. The cooling fluid in the second channels C2 thus has increased irregularity and dispersity, providing a higher degree of jet impingement cooling. Accordingly, the present disclosure can secure cooling performance of power modules 10 through the jet impingement cooling effect caused by the cooling channel portions 21 of the manifold cover 20 and the cooling fins 31 of the fin plate 30.

According to an exemplary embodiment of the present disclosure, a plurality of power modules 10 are configured in the internal space of the manifold cover 20. If a plurality of power modules 10 are configured, however, the cooling efficiency of power modules 10 which are cooled later is degraded compared with that of power modules 10 which are cooled first.

Therefore, respective cooling channel portions 21 of the manifold cover 20 according to an exemplary embodiment of the present disclosure are configured so that along the direction in which the cooling fluid is circulated, the number of first channels C1 or second channels C2 is reduced. This guarantees that cooling channel portions 21 through which the cooling fluid is circulated first has less pressure loss of the cooling fluid and lower cooling performance because of the larger number of first channels C1 or second channels C2 than following cooling channel portions 21, and cooling channel portions 21 through which the cooling fluid is circulated later has increased pressure loss of the cooling fluid and improved cooling performance because of the smaller number of first channels C1 or second channels C2.

As a result, even if a plurality of power modules 10 are provided inside the manifold cover 20, cooling channel portions 21 corresponding to respective power modules 10 have different number of first channels C1 or second channels C2 so that by differentiating the cooling performance, the temperature distribution of respective power modules 10 is balanced.

The above-described present disclosure will now be described in more detail. A plurality of power modules 10 are disposed in series in the internal space of the manifold 20, and the cooling channel portions 21 may thus be disposed in series in the direction in which respective power modules 10 are aligned.

Accordingly, the fluid circulated in the internal space of the manifold cover 20 passes through respective cooling channel portions 21 and cool respective power modules 10. Furthermore, the path in which the cooling fluid passing through each cooling channel portion 21 is circulated to the next cooling channel portion 21 is simplified, reducing the cooling fluid circulation loss. That is, compared with a scheme in which a plurality of power modules 10 are provided in parallel so that a cooling fluid is circulated through respective cooling channel portions 21 provided in parallel, power modules 10 may be cooled at a larger mass flow rate by cooling channel portions 21 disposed in series.

FIG. 1 discloses an exemplary embodiment, in which respective cooling channel portions 21 may include the same number of first channels C1 as that of second channels C2.

Figure 4:
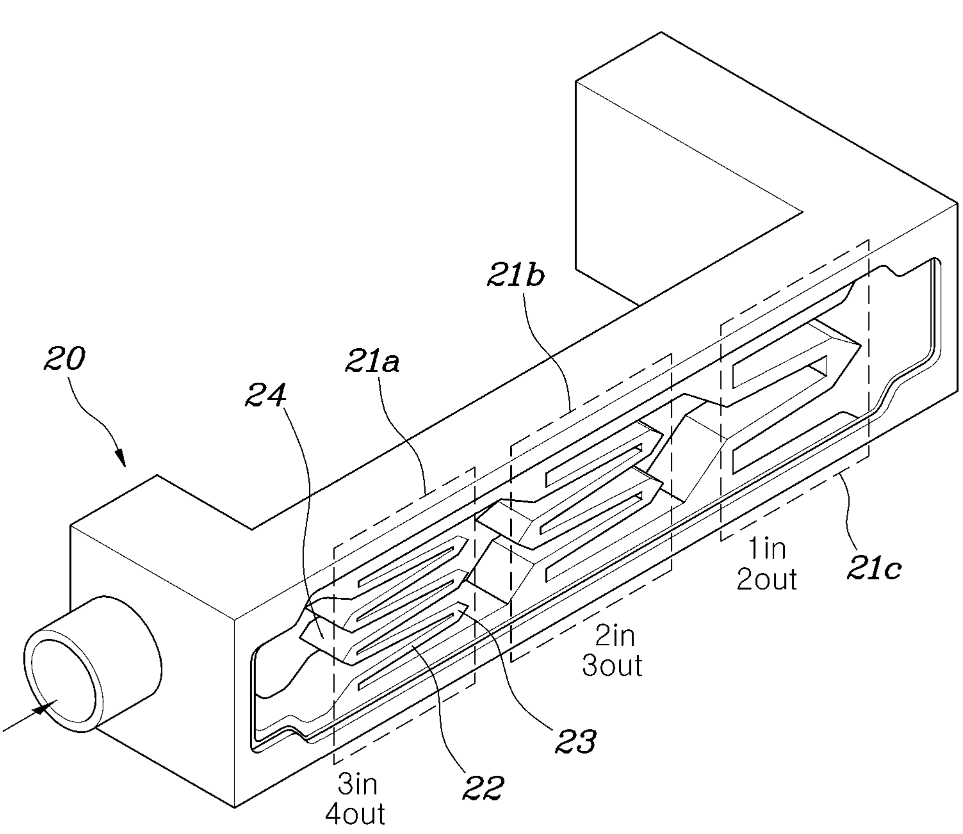
FIG. 4 illustrates an exemplary embodiment of a cooling channel portion of a manifold cover according to an exemplary embodiment of the present disclosure.
Figure 5:
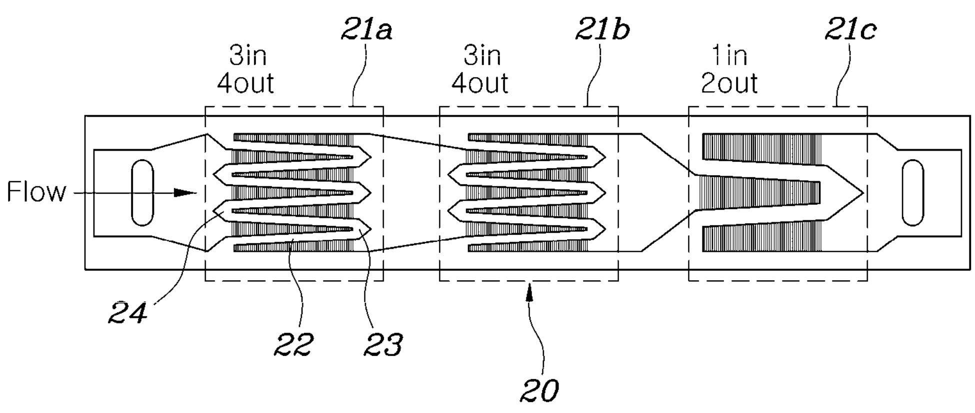
FIG. 5 illustrates another exemplary embodiment of a cooling channel portion of a manifold cover according to an exemplary embodiment of the present disclosure.
Figure 6:
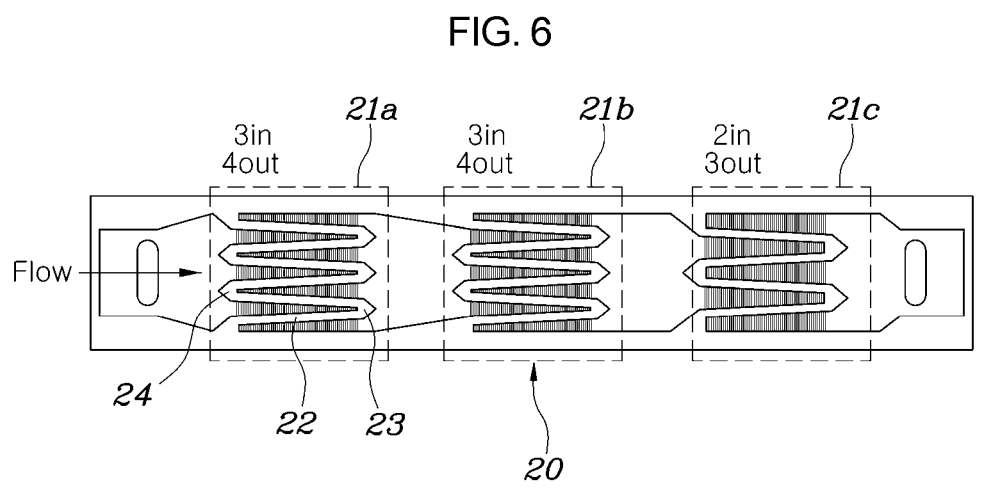

Meanwhile, as shown in FIGS. 4, 5 and 6, respective cooling channel portions 21 may include a smaller number of first channels C1 than that of second channels C2.

Each cooling channel portion 21 includes a first channel C1, the entrance of which is open, and a second channel C2, the exit of which is open. A smaller number of first channels C1 are formed than that of second channels C2 so that the pressure at the entrance of the first channels C1 is higher than the pressure at the exist of the second channels C2, facilitating circulation of the cooling fluid. That is, a plurality of cooling fins 31 facilitate the flow of a fluid that has flowed into the first channels C1 when being circulated to the exit of the second channels C2 at which the pressure is lower. Accordingly, the efficiency of jet impingement cooling is improved as the fluid is circulated from the first channels C1 to the second channels C2 through the cooling fins 31.

Meanwhile, the power modules 10 include a first power module 11, a second power module 12, and a third power module 13. The cooling channel portions 21 include a first cooling channel portion 21*a*, a second cooling channel portion 21*b*, and a third cooling channel portion 21*c*.

The first power module 11 may be configured in a U phase, the second power module 12 may be configured in a V phase, and the third power module 13 may be configured in a W phase, providing three-phase AC power to the outside through each power module 10.

Accordingly, the cooling channel portions 21 of the manifold cover 20 may include a first cooling channel portion 21*a* for cooling the first power module 11, a second cooling channel portion 21*b* for cooling the second power module 12, and a third cooling channel portion 21*c* for cooling the third power module 13. Furthermore, the first power module 11, the second power module 12, and the third power module 13 may be successively disposed in series along the direction in which a cooling fluid is circulated in the internal space of the manifold cover 20 so that the first cooling channel portion 21*a*, the second cooling channel portion 21*b*, and the third cooling channel portion 21*c* are also disposed in series while being spaced apart according to the disposition of respective power modules 10.

However, the cooling fluid is circulated while successively cooling the first power module 11, the second power module 12, and the third power module 13, and the cooling fluid is circulated to the third power module 13 after having a high temperature through heat exchange with each preceding power module 10, degrading the cooling efficiency of the third power module 13.

Therefore, the third cooling channel portion 21*c* according to an exemplary embodiment of the present disclosure may include a smaller number of first channels C1 or second channels C2 than that of first channels C1 or second channels C2 of the first cooling channel portion 21*a* and the second cooling channel portion 21*b*.

In an exemplary embodiment of the present disclosure, as illustrated in FIG. 4, the first cooling channel portion 21*a* may have three first channels C1 and fourth second channels C2 formed therein, the second cooling channel portion 21*b* may have two first channels C1 and three second channels C2 formed therein, and the third cooling channel portion 21*c* may have one first channel C1 and two second channels C2 formed therein.

In another exemplary embodiment of the present disclosure, as illustrated in FIG. 5, the first cooling channel portion 21*a* may have three first channels C1 and fourth second channels C2 formed therein, the second cooling channel portion 21*b* may have three first channels C1 and four second channels C2 formed therein, and the third cooling channel portion 21*c* may have one first channel C1 and two second channels C2 formed therein.

In another exemplary embodiment of the present disclosure, as illustrated in FIG. 6, the first cooling channel portion 21*a* may have three first channels C1 and fourth second channels C2 formed therein, the second cooling channel portion 21*b* may have three first channels C1 and four second channels C2 formed therein, and the third cooling channel portion 21*c* may have two first channels C1 and three second channels C2 formed therein.

Accordingly, according to an exemplary embodiment of the present disclosure, the cooling channel portion 21 last reached by a cooling fluid in the direction in which the cooling fluid is circulated includes a smaller number of first channels C1 or second channels C2 than that of other preceding cooling channel portions 21 so that the first cooling channel portion 21*a* and the second cooling channel portion 21*b* have less pressure loss of the cooling fluid and have degraded cooling performance, and the third cooling channel portion 21*c* has increased pressure loss of the cooling fluid and has improved cooling performance.

Accordingly, the cooling flow rate of the cooling fluid may be concentrated in the third cooling channel portion 21*c*.

This guarantees the cooling performance of the third cooling channel portion 21*c*, reaching a balance in temperature distribution with other cooling channel portions 21.

Meanwhile, as illustrated in FIG. 1, the manifold cover 20 includes a first manifold cover 20*a* and a second manifold cover 20*b* including one of an inlet 25 and an outlet 26, and the fin plate 30 includes a first fin plate 30*a* including a first circulation hole 32 and a second fin plate 30*b* including a second circulation hole 33, which are disposed to abut both side surfaces of power modules 10, respectively so that a cooling fluid is circulated between respective manifold covers 20, cooling both surfaces of the power modules 10.

According to an exemplary embodiment of the present disclosure, the first manifold cover 20*a* includes an inlet 25, and the second manifold cover 20*b* includes an outlet 26. Accordingly, a cooling fluid which has flowed in through the inlet 25 of the first manifold cover 20*a* is circulated to first channels C1 and second channels C2 inside the first manifold cover 20*a* through the cooling channel portion 21 of the first manifold cover 20*a* and the cooling fin 31 of the first fin plate 30*a*, implementing jet impingement cooling. After passing through the first circulation hole 32 and the second circulation hole 33, the cooling fluid is circulated to first channels C1 and second channels C2 inside the second manifold cover 20*b* through the cooling channel portion 21 of the second manifold cover 20*b* and the cooling fin 31 of the second fin plate 30*b*, implementing jet impingement cooling. As a result, both side surfaces of the power modules 10 may be cooled.

Each of the first manifold cover 20*a* and the second manifold cover 20*b* may include an inlet 25 or an outlet 26 formed on one side thereof, and the first circulation hole 32 of the first fin plate 30*a* and the second circulation hole 33 of the second fin plate 30*b* may be formed on the other side thereof.

According to an exemplary embodiment of the present disclosure, the first manifold cover 20*a* may include an inlet, and the second manifold cover 20*b* may include an outlet 26. The inlet 25 and the outlet 26 may be disposed on a straight line so that a single manifold cover 20 is fabricated, implementing the first manifold cover 20*a* and the second manifold cover 20*b*.

Each manifold cover 20*a* includes an inlet 25 and an outlet 26 positioned on one side, and each fin plate 30 includes a circulation hole positioned on the other side, forming a circulation flow of a cooling fluid through the inlet 25, the first manifold cover 20*a* and the first fin plate 30*a*, the first circulation hole 32, the second circulation hole, the second manifold cover 20*b* and the second fin plate 30*b*, and the outlet 26. Moreover, jet impingement cooling is implemented by a fluid flow in first channels C1 and second channels C2 formed by the first manifold cover 20*a* and the first fin plate 30*a*, exchanging heat with one side surface of power modules 10, and jet impingement cooling is implemented by a fluid flow in first channels C1 and second channels C2 formed by the second manifold cover 20*b* and the second fin plate, exchanging heat with the other side surface of power modules 10. As a result, both surfaces of the power modules 10 may be cooled.

The power module cooling device including the above-described structure is configured so that a cooling fluid is eject perpendicularly to heating surfaces through cooling fins 31 of fin plates configured perpendicularly to the manifold cover 20, generating a vertical turbulent flow. Accordingly, cooling efficiency is secure, and the flow characteristics of the cooling fluid are improved, minimizing flow rate loss due to the vertical turbulent flow.

Respective cooling channels 21 of the manifold cover 20 corresponding to respective power modules 10 have different cooling performances so that respective power modules 10 are cooled in a balanced manner. Accordingly, cooling imbalance is removed, and the power modules 10 are thus stabilized and maintain performance.

For convenience in explanation and accurate definition in the appended claims, the terms “upper”, “lower”, “inner”, “outer”, “up”, “down”, “upwards”, “downwards”, “front”, “rear”, “back”, “inside”, “outside”, “inwardly”, “outwardly”, “interior”, “exterior”, “internal”, “external”, “forwards”, and “backwards” are used to describe features of the exemplary embodiments with reference to the positions of such features as displayed in the figures. It will be further understood that the term “connect” or its derivatives refer both to direct and indirect connection.

The term “and/or” may include a combination of a plurality of related listed items or any of a plurality of related listed items. For example, “A and/or B” includes all three cases such as “A”, “B”, and “A and B”.

In the present specification, unless stated otherwise, a singular expression includes a plural expression unless the context clearly indicates otherwise.

In exemplary embodiments of the present disclosure, “at least one of A and B” may refer to “at least one of A or B” or “at least one of combinations of at least one of A and B”. Furthermore, “one or more of A and B” may refer to “one or more of A or B” or “one or more of combinations of one or more of A and B”.

In the exemplary embodiment of the present disclosure, it should be understood that a term such as “include” or “have” is directed to designate that the features, numbers, steps, operations, elements, parts, or combinations thereof described in the specification are present, and does not preclude the possibility of addition or presence of one or more other features, numbers, steps, operations, elements, parts, or combinations thereof.

The foregoing descriptions of specific exemplary embodiments of the present disclosure have been presented for purposes of illustration and description. They are not intended to be exhaustive or to limit the present disclosure to the precise forms disclosed, and obviously many modifications and variations are possible in light of the above teachings. The exemplary embodiments were chosen and described in order to explain certain principles of the invention and their practical application, to enable others skilled in the art to make and utilize various exemplary embodiments of the present disclosure, as well as various alternatives and modifications thereof. It is intended that the scope of the present disclosure be defined by the Claims appended hereto and their equivalents.

What is claimed is:

1. A power module cooling apparatus comprising:

a manifold cover including:

an internal space in which a cooling fluid is circulated, wherein a plurality of power modules are disposed in the internal space; and a plurality of cooling channel portions being formed to match with respective power modules, wherein each of the plurality of cooling channel portions includes a first channel open in a direction in which the cooling fluid flows in and a second channel open in a direction in which the cooling fluid flows out; and a fin plate disposed in the manifold cover to abut the plurality of power modules, and including cooling fins facing the plurality of cooling channel portions so that the cooling fluid which has flowed into the first channels flows between the cooling fins and then flows out through the second channels, wherein the plurality of cooling channel portions corresponding to the respective power modules have different number of channels, wherein the plurality of power modules are disposed in series in the internal space of the manifold cover so that the plurality of cooling channel portions are disposed in series in a direction in which respective power modules are aligned, wherein a direction of extension of the plurality of cooling channel portions and a direction of extension of the cooling fins intersect perpendicularly, and wherein a last cooling channel portion adjacent to an outlet among the plurality of cooling channel portions includes a smaller number of first channels formed therein than first channels of remaining channel portions adjacent to an inlet among the plurality of cooling channel portions.

2. The power module cooling apparatus of claim 1, wherein respective cooling channel portions include a smaller number of the first channels formed therein than the second channels therein.

3. The power module cooling apparatus of claim 1, wherein the last cooling channel portion among the plurality of cooling channel portions includes a smaller number of second channels formed therein than second channels of the remaining channel portions among the plurality of cooling channel portions.

4. The power module cooling apparatus of claim 3, wherein a number of the first channels in the last cooling channel portion among the plurality of cooling channel portions is smaller than a number the second channels formed in the last cooling channel.

5. The power module cooling apparatus of claim 3, wherein a number of the first channels formed in the last cooling channel portion among the plurality of cooling channel portions is smaller than to a number of the first channels or a number of the second channels formed in the remaining cooling channels.

6. The power module cooling apparatus of claim 3, wherein a number of the second channels formed in the last cooling channel portion among the plurality of cooling channel portions is smaller than or equal to a number of the first channels formed in the remaining cooling channels.

7. The power module cooling apparatus of claim 1, wherein the plurality of power modules include a first power module, a second power module, and a third power module, wherein the plurality of cooling channel portions include a first cooling channel portion, a second cooling channel portion, and a third cooling channel portion, and wherein the third cooling channel portion includes a smaller number of first channels or second channels formed therein than first channels or second channels of the first cooling channel portion and the second cooling channel portion.

8. The power module cooling apparatus of claim 1, wherein the plurality of cooling channel portions include a plurality of first barrier portions extending to delimit the first channels and the second channels, a plurality of second barrier portions connected to the plurality of first barrier portions on first and second sides at end portions of the first channels in a direction in which the cooling fluid flows out, and a plurality of third barrier portions connected to the plurality of first barrier portions on first and second sides at end portions of the second channels in a direction in which the cooling fluid flows in.

9. The power module cooling apparatus of claim 8, wherein the plurality of second barrier portions and the plurality of third barrier portions are disposed alternately to connect the plurality of first barrier portions so that the first channels and the second channels are disposed alternately.

10. The power module cooling apparatus of claim 8, wherein a direction of extension of the plurality of first barrier portions and the direction of extension of the cooling fins intersect perpendicularly.

11. The power module cooling apparatus of claim 1, wherein the manifold cover includes a first manifold cover and a second manifold cover including the inlet and the outlet therein, and wherein the fin plate includes a first fin plate and a second fin plate disposed to abut first and second side surfaces of the plurality of power modules, respectively, the first fin plate including a first circulation hole formed therein and the second fin plate including a second circulation hole formed therein so that the cooling fluid is circulated between respective first and second manifold covers, cooling the first and second surfaces of the plurality of power modules.

12. The power module cooling apparatus of claim 11, wherein each of the first manifold cover and the second manifold cover includes the inlet or the outlet formed on a first side thereof, and the first circulation hole of the first fin plate and the second circulation hole of the second fin plate are formed on a second side thereof.

* * * * *